US011101137B1

(12) United States Patent
Niu et al.

(10) Patent No.: US 11,101,137 B1
(45) Date of Patent: Aug. 24, 2021

(54) METHOD OF MAKING REVERSE CONDUCTING INSULATED GATE BIPOLAR TRANSISTOR

(71) Applicant: ALPHA AND OMEGA SEMICONDUCTOR INTERNATIONAL LP, Sunnyvale, CA (US)

(72) Inventors: Zhiqiang Niu, Santa Clara, CA (US); Long-Ching Wang, Cupertino, CA (US); Yueh-Se Ho, Sunnyvale, CA (US); Lingpeng Guan, San Jose, CA (US); Wenjun Li, Portland, OR (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 23 days.

(21) Appl. No.: 16/824,598

(22) Filed: Mar. 19, 2020

(51) Int. Cl.
*H01L 21/425* (2006.01)
*H01L 21/308* (2006.01)
*H01L 29/66* (2006.01)
*H01L 21/8222* (2006.01)
*H01L 21/3213* (2006.01)
*H01L 21/304* (2006.01)
*H01L 21/02* (2006.01)
*H01L 21/306* (2006.01)
*H01L 21/82* (2006.01)
*H01L 21/04* (2006.01)

(52) U.S. Cl.
CPC ...... *H01L 21/308* (2013.01); *H01L 21/02378* (2013.01); *H01L 21/046* (2013.01); *H01L 21/0475* (2013.01); *H01L 21/304* (2013.01); *H01L 21/30604* (2013.01); *H01L 21/32134* (2013.01); *H01L 21/8213* (2013.01); *H01L 21/8222* (2013.01); *H01L 29/66325* (2013.01)

(58) Field of Classification Search
CPC ............ H01L 29/66325; H01L 21/308; H01L 21/8222; H01L 21/32134; H01L 21/304; H01L 21/30604; H01L 21/02378; H01L 21/046; H01L 21/0475; H01L 21/8213
See application file for complete search history.

(56) References Cited

U.S. PATENT DOCUMENTS

| | | | |
|---|---|---|---|
| 9,614,106 B2* | 4/2017 | Yoshida | H01L 29/0834 |
| 2010/0308370 A1* | 12/2010 | Hshieh | H01L 29/7397 257/136 |
| 2014/0070270 A1* | 3/2014 | Yoshida | H01L 29/7397 257/140 |
| 2014/0225126 A1* | 8/2014 | Aketa | H01L 21/02529 257/77 |
| 2019/0157436 A1* | 5/2019 | Lau | H01L 29/401 |

* cited by examiner

*Primary Examiner* — Shouxiang Hu
(74) *Attorney, Agent, or Firm* — Chen-Chi Lin (57) ABSTRACT

A process is applied to develop a plurality of reverse conducting insulated gate bipolar transistors (RCIGBTs). The process comprises the steps of providing a wafer, applying a first grinding process, patterning a mask, applying an etching process, removing the mask, implanting N++ type dopant, applying a second grinding process forming a TAIKO ring, implanting P+ type dopant, annealing and depositing TiNiAg or TiNiVAg, removing the TAIKO ring, attaching a tape, and applying a singulation process. The mask can be a soft mask or a hard mask. The etching process can be a wet etching only; a wet etching followed by a dry etching; or a dry etching only.

15 Claims, 9 Drawing Sheets

METHOD OF MAKING REVERSE CONDUCTING INSULATED GATE BIPOLAR TRANSISTOR

FIELD OF THE INVENTION

This invention relates generally to a method of making an RCIGBT. More particularly, the present invention relates to a method of making the RCIGBT using back side deep trench etching followed by a TAIKO grinding process.

BACKGROUND OF THE INVENTION

A wafer for fabrication of RCIGBTs is frequently under backside grinding to reduce thickness of the wafer to a range of 50 µm to 75 µm. Taiko ring has been introduced and has been proven to be effective to mechanically support a wafer with the reduced thickness during wafer handling. However, it is still challenging, even with a Taiko ring, to apply the fabrication process of photo resistor spinning, lithography, development and etching to the wafer range from 50 µm to 75 µm.

The present disclosure starts with a thick wafer in a range from 200 um to 700 um. A thicker wafer may be used by applying a grinding process to reduce wafer thickness to the range from 200 µm to 700 µm. A wafer with a thickness in range from 200 µm to 700 µm has sufficient mechanical strength and does not require Taiko ring support. Taiko ring is not introduced to the fabrication process of RCIGBTs of the present disclosure until later steps. Therefore, the present disclosure significantly increases wafer handling capability.

SUMMARY OF THE INVENTION

The present invention discloses a process to fabricate a plurality of reverse conducting insulated gate bipolar transistors (RCIGBTs). The process comprises the steps of providing a wafer, applying an optional first grinding process, patterning a mask, applying an etching process, removing the mask, implanting N++ type dopant, applying a second grinding process forming a TAIKO ring, implanting P+ type dopant, annealing and depositing TiNiAg or TiNi-VAg, removing the TAIKO ring, attaching a tape, and applying a singulation process.

The mask can be a soft mask or a hard mask. The etching process can be a wet etching only; a wet etching followed by a dry etching; or a dry etching only.

DETAILED DESCRIPTION OF THE INVENTION

Figure 1:
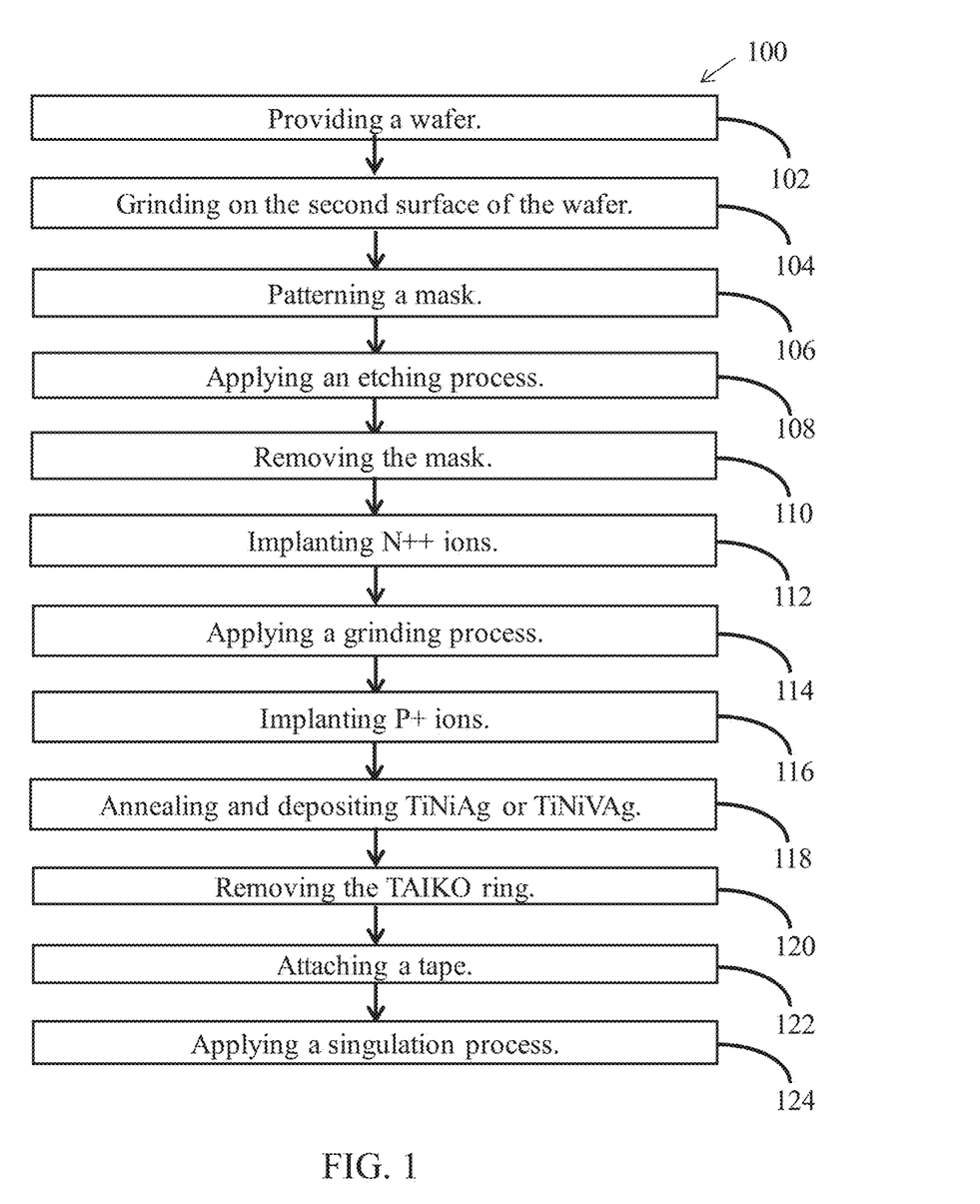
FIG. 1 is a flowchart of a process to develop a plurality of reverse conducting insulated gate bipolar transistors (RCIGBTs) in examples of the present disclosure.

FIG. 1 is a flowchart of a process 100 to develop a plurality of reverse conducting insulated gate bipolar transistors (RCIGBTs) in examples of the present disclosure. The process 100 may start from block 102. FIGS. 4A-4I show the cross sections of the corresponding steps.

Figure 4A:
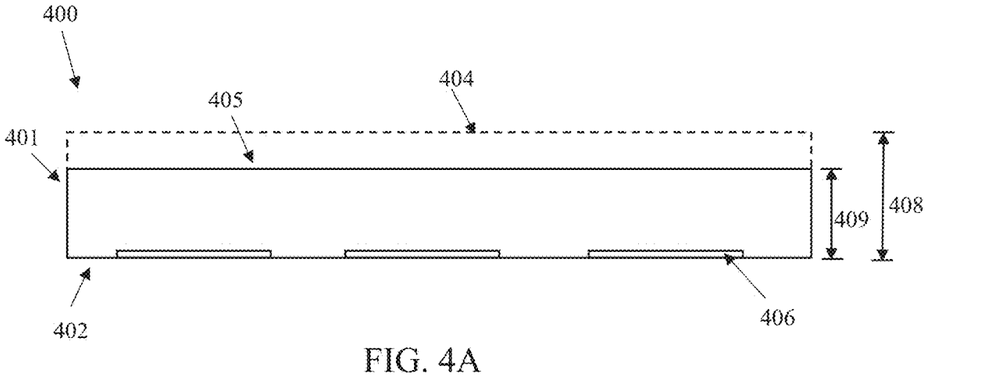
FIGS. 4A, 4B, 4C, 4D, 4E, 4F, 4G, 4H, and 4I show the steps of the process to fabricate a plurality of RCIGBTs in examples of the present disclosure.

In block 102, referring now to FIG. 4A, a wafer 400 (shown in dashed lines) is provided. The wafer 400 comprises a first surface 402 (front surface) on a front side and a second surface 404 (back surface) on a back side. The second surface 404 is opposite to the first surface 402. A thickness of the wafer 400 may be in a range from 500 µm to 1,000 µm. A plurality of semiconductor device chip areas 406 are formed on the first surface 402 of the wafer 400. Each of the plurality of chip areas 406 may include an insulated gate bipolar transistor (IGBT) top structure formed on a top portion of a N− epitaxial layer wafer substrate. Block 102 may be followed by block 104.

In block 104, referring now to FIG. 4A, a grinding process is applied on the second surface 404 of the wafer 400 forming a thinned wafer 401. The thinned wafer 401 has a grinding processed second surface 405. The thinned wafer 401 has a predetermined thickness. The predetermined thickness of the thinned wafer 401 is in a range from 200 µm to 700 µm. An entirety of the grinding processed second surface 405 of the thinned wafer 401 is flat. In current fabrication step, the thinned wafer 401 excludes a TAIKO ring surrounds the grinding processed second surface 405 because 200 µm to 700 µm thick thinned wafer 401 has sufficient mechanical strength. If the original wafer 400 has a thickness of 700 um or less, then the grinding process in block 104 may be skipped. Block 104 may be followed by block 106.

Figure 2:
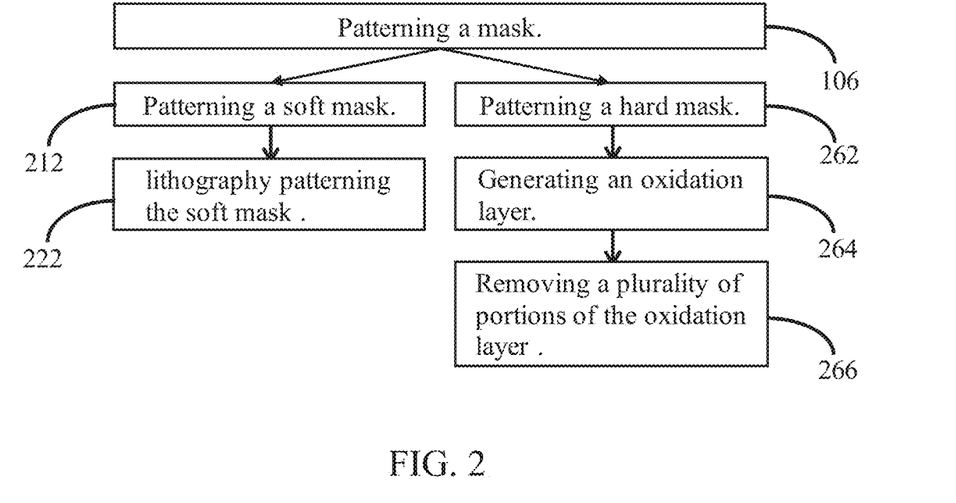
FIG. 2 is a flowchart of a process to pattern a mask in examples of the present disclosure.
Figure 4B:
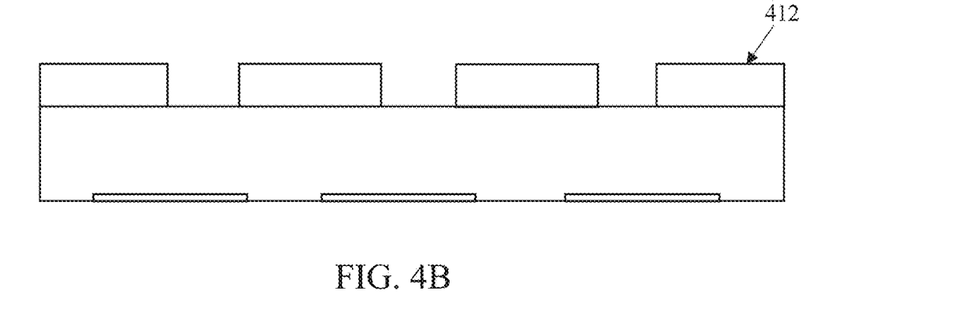
Figure 7A:
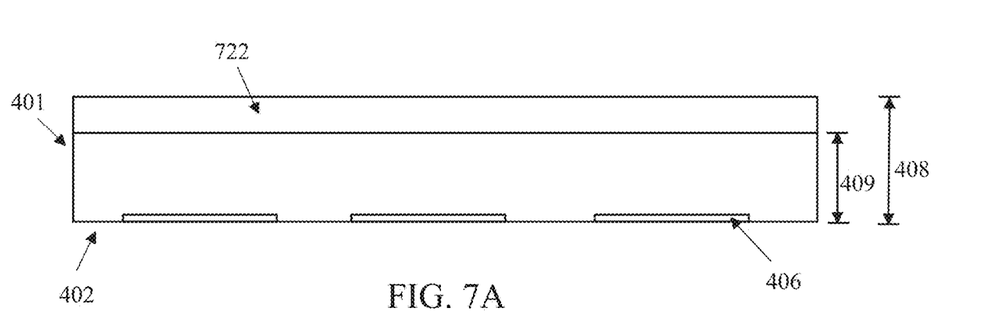
FIGS. 7A and 7B show the steps of the process to develop a hard mask in examples of the present disclosure.
Figure 7B:
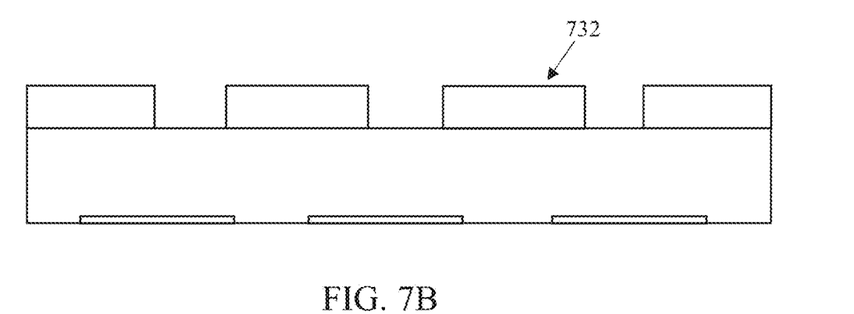

In block 106, referring now to FIG. 4B, a mask 412 is patterned on the grinding processed second surface 405 of the thinned wafer 401. Referring now to FIG. 2, the mask 412 may be a soft mask 212 or a hard mask 262. For the case that the mask is a soft mask, the step (block 106 of FIGS. 1 and 2) of patterning the mask comprises the sub-step (block 222 of FIG. 2) of lithography patterning the soft mask on the thinned wafer 401. For the case that the mask is a hard mask, the step (block 106 of FIGS. 1 and 2) of patterning the mask comprises the sub-step (block 264 of FIG. 2) of generating an oxidation layer 722 of FIG. 7A on the thinned wafer 401, followed by the sub-step (block 266 of FIG. 2) of removing a plurality of portions of the oxidation layer forming the hard mask 732 of FIG. 7B. Block 106 may be followed by block 108.

Figure 3:
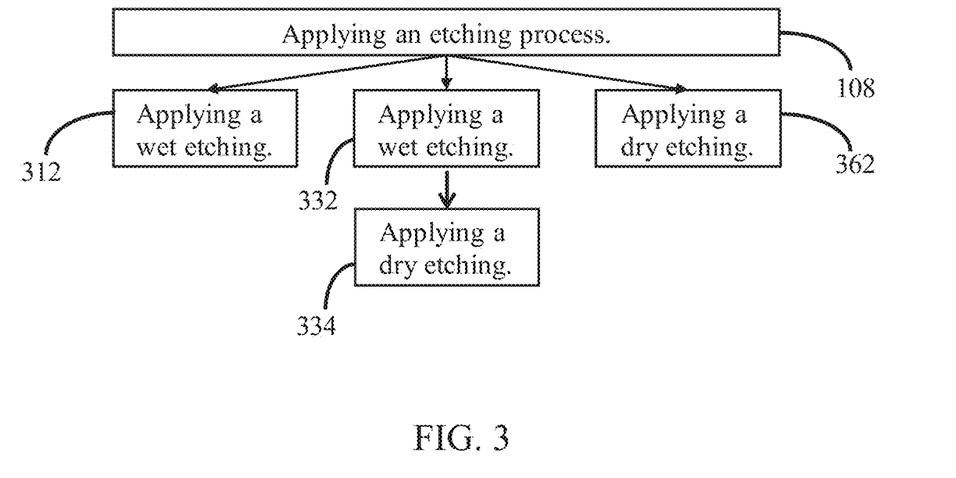
FIG. 3 is a flowchart to apply an etching process in examples of the present disclosure.
Figure 4C:
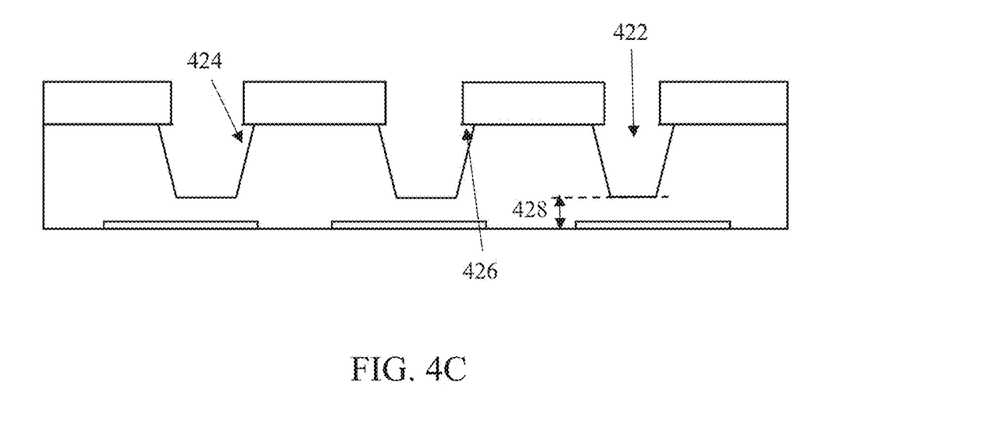
Figure 8A:
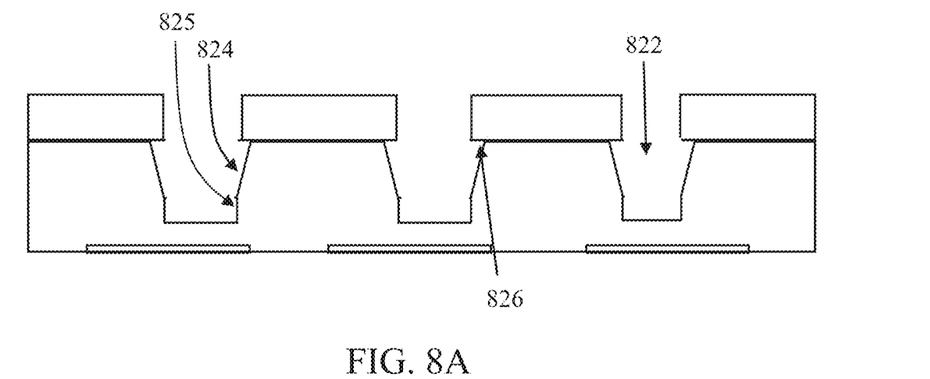
FIGS. 8A, 8B, and 8C show the steps after a wet etching and a dry etching in examples of the present disclosure.
Figure 9A:
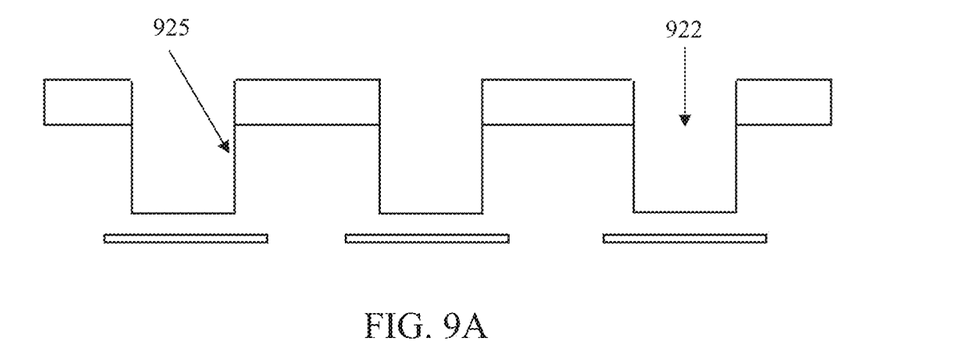
FIGS. 9A, 9B, and 9C show the steps after a dry etching in examples of the present disclosure.

In block 108, referring now to FIGS. 4C, 8A, and 9A, an etching process is provided. In FIG. 3, the etching process may be a single wet etching (block 312), a wet etching (block 332) followed by a dry etching (block 334), or a single dry etching (block 362). If the etching is the single wet etching (block 312), the plurality of etched recesses 422 of FIG. 4C comprises a plurality of slanted surfaces 424 of FIG. 4C. A thickness 428 of a portion of the thinned wafer directly under an etched window is in a range from 50 µm to 90 µm. The soft mask comprises a plurality of overhang regions 426. If the etching is the wet etching (block 332) followed by the dry etching (block 334), the plurality of etched recesses 822 of FIG. 8A comprises a plurality of slanted surfaces 824 of FIG. 8A above a plurality of vertical surfaces 825 of FIG. 8A. The soft mask comprises a plurality of overhang regions 826. If the etching is the single dry etching (block 362), the plurality of etched recesses 922 of FIG. 9A comprises a plurality of vertical surfaces 925 of FIG. 9A. The hard mask does not have overhang regions in FIG. 9A. Block 108 may be followed by block 110.

Figure 4D:
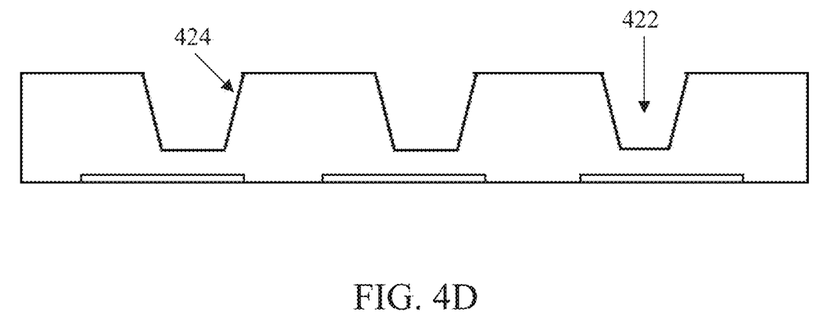
Figure 8B:
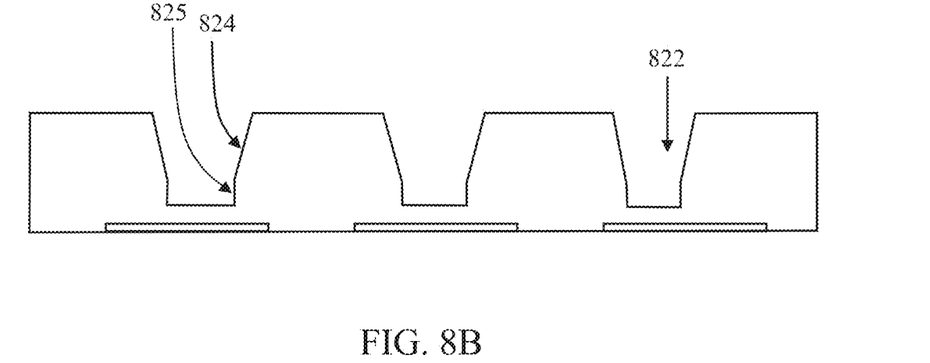
Figure 9B:
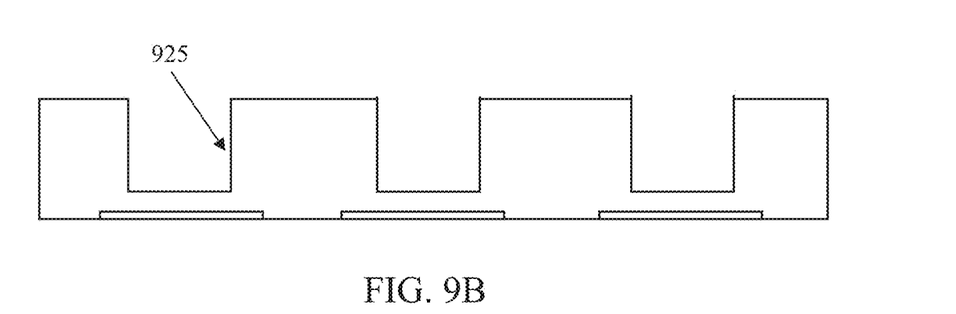

In block 110, referring now to FIGS. 4D, 8B, and 9B, the mask 412 is removed. If the etching is the single wet etching (block 312), the plurality of etched recesses 422 of FIG. 4D comprises a plurality of slanted surfaces 424 of FIG. 4D. If the etching is the wet etching (block 332) followed by the dry etching (block 334), the plurality of etched recesses 822 of FIG. 8B comprises a plurality of slanted surfaces 824 of FIG. 8B above a plurality of vertical surfaces 825 of FIG. 8B. If the etching is the single dry etching (block 362), the plurality of etched recesses 922 of FIG. 9B comprises a plurality of vertical surfaces 925 of FIG. 9B. Block 110 may be followed by block 112.

Figure 4E:
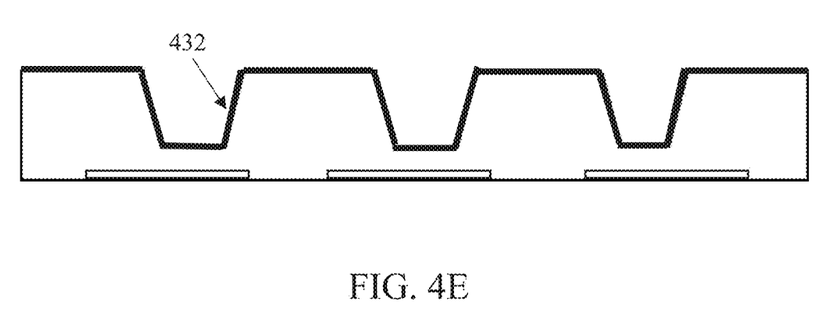
Figure 8C:
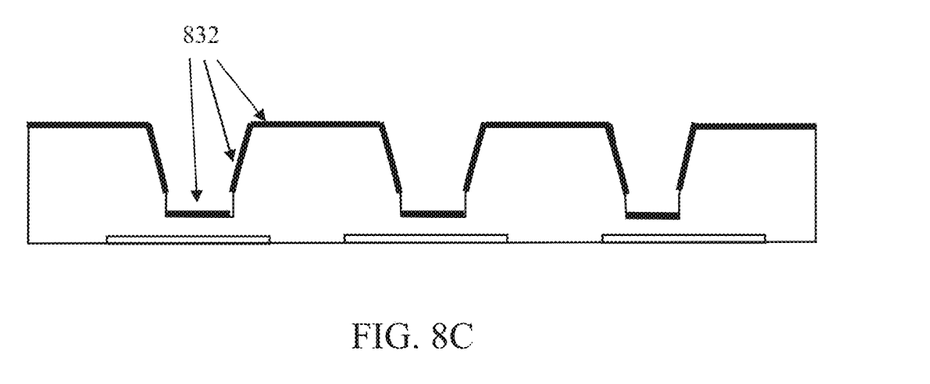
Figure 9C:
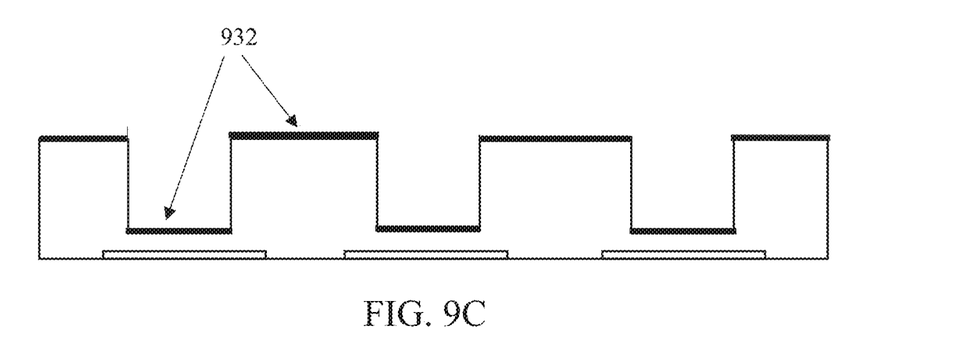

In block 112, referring now to FIGS. 4E, 8C, and 9C, N++ type dopant is blanket implanted vertically from the back side onto the wafer without a mask. If the etching is the single wet etching (block 312), N++ type dopant 432 of FIG. 4E implanted on horizontal surfaces and the plurality of slanted surfaces 424 of FIG. 4D. If the etching is the wet etching (block 332) followed by the dry etching (block 334), N++ type dopant 832 of FIG. 8C implanted on horizontal surfaces, the plurality of slanted surfaces 824 of FIG. 8B. If the etching is the single dry etching (block 362), N++ type dopant 932 of FIG. 9C implanted on horizontal surfaces of FIG. 9B. Block 112 may be followed by block 114.

In examples of the present disclosure, double plus (++) heavily doped has ion concentration in a range above $10^{18}$ cm$^{-3}$. Plus doped (+) has ion concentration in a range from $10^{16}$ to $10^{18}$ cm$^{-3}$. Lightly doped has ion concentration in a range below $10^{16}$ cm$^{-3}$.

Figure 4F:
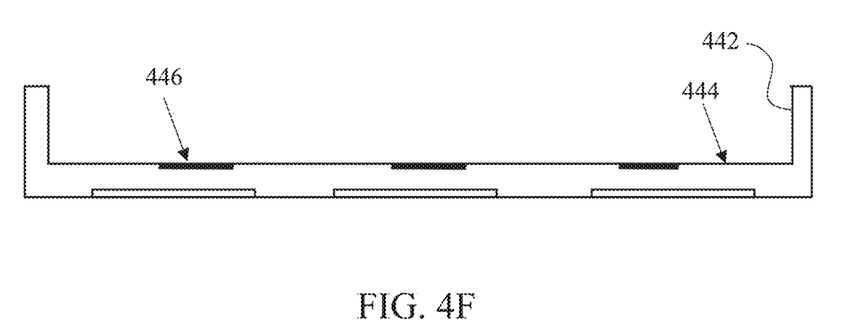

In block 114, referring now to FIG. 4F, a grinding process is applied. A TAIKO ring 442 surrounding a flat surface 444 is formed. N++ type dopant implanted regions 446 remains on the wafer. Block 114 may be followed by block 116.

Figure 4G:
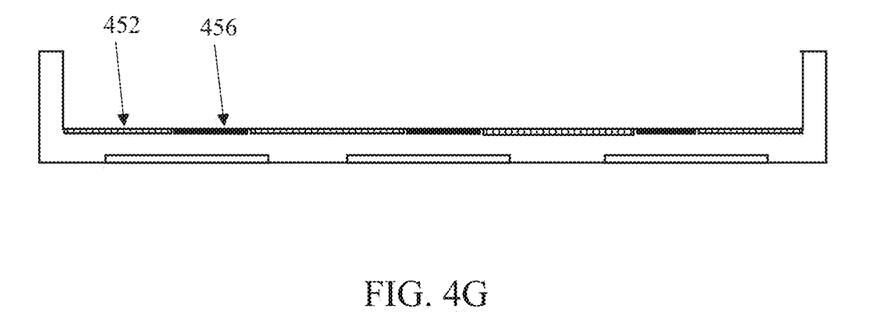

In block 116, referring now to FIG. 4G, P+ type dopant is blanket implanted vertically from the back side onto the wafer without a mask. A plurality of P+ type dopant implanted regions 452 are formed. N++ type dopant implanted regions 446 of FIG. 4F become equivalent to N+ type dopant implanted regions 456 of FIG. 4F. Block 116 may be followed by block 118.

Figure 4H:
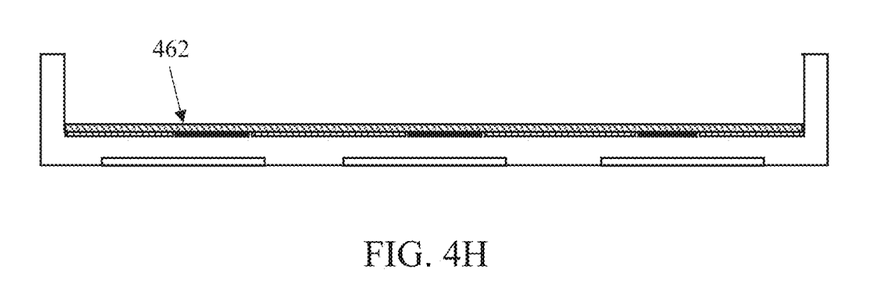

In block 118, referring now to FIG. 4H, an annealing process is applied and TiNiAg or TiNiVAg 462 is deposited. Block 118 may be followed by block 120.

Figure 4I:
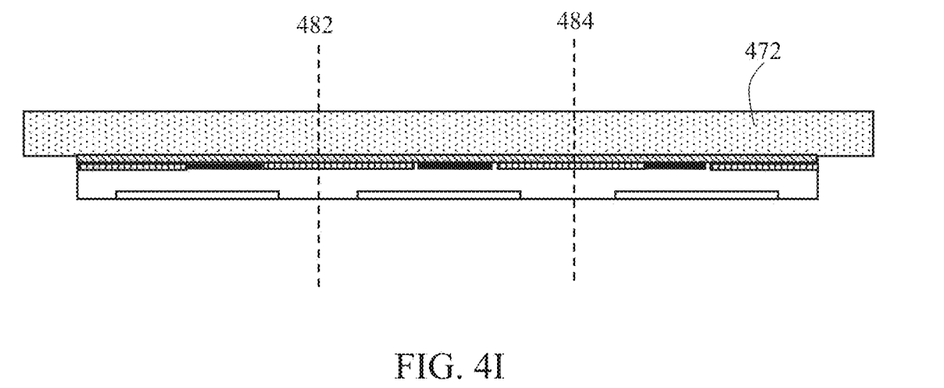

A In block 120, referring now to FIG. 4I, the TAIKO ring 442 is removed. Block 120 may be followed by block 122.

In block 122, referring now to FIG. 4I, a tape 472 is attached. Block 122 may be followed by block 124.

In block 124, referring now to FIG. 4I, a singulation process along lines 482 and 484 are applied so as to form the plurality of RCIGBTs.

Figure 5:
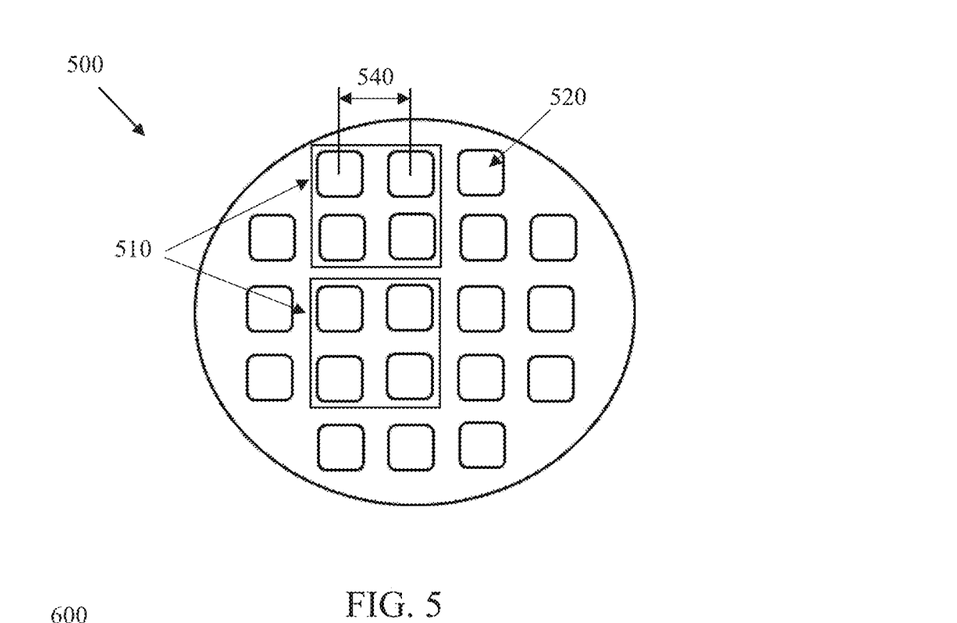
FIG. 5 is a rear view of a wafer with a plurality of fast recovery diode (FRD) areas in examples of the present disclosure.

FIG. 5 is a rear view of a wafer 500 with a plurality of RCIGBT chips 510 formed thereon. As shown, each RCIGBT chip 510 may comprise one or more of the N+ type dopant implanted regions 456 on the RCIGBT chip forming fast recovery diode (FRD) areas 520 in examples of the present disclosure. In one example, each of the plurality of FRD areas 520 is of a rectangular shape. In one example, each of the plurality of FRD areas 520 is of a square shape. A window size of each of the plurality of FRD areas 520 is at least 30 μm by 30 μm. The plurality of FRD areas 520 may take a different shape, such as a circle or a rectangular shape. In any case, a minimum size of linear dimension is at least 30 um. A pitch 540 between adjacent FRDs on a same RCIGBT chip may be in a range from 1 mm to 2 mm.

Figure 6:
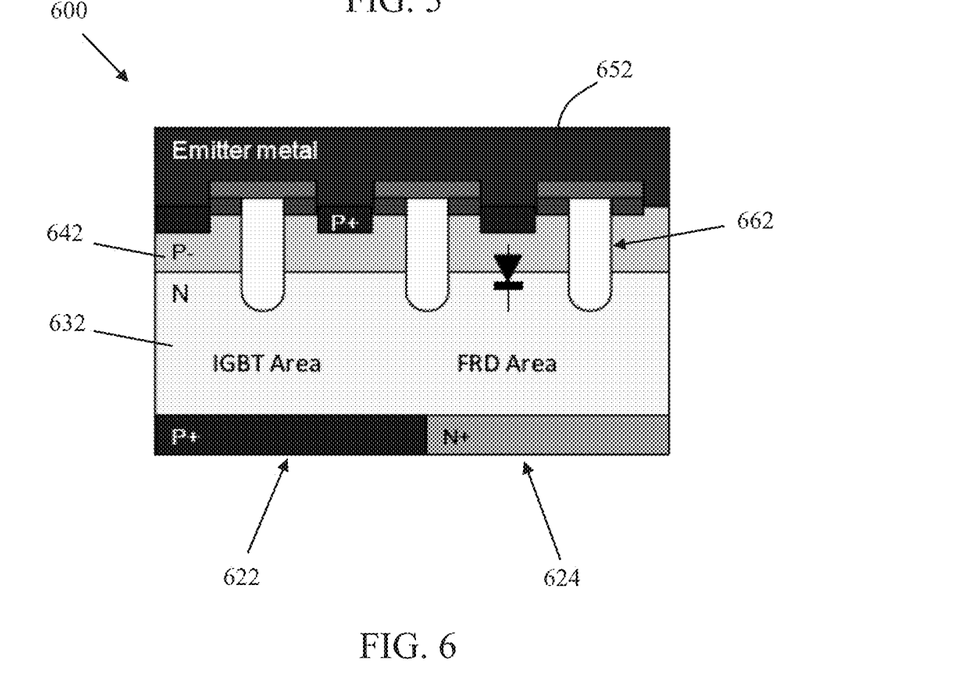
FIG. 6 is a cross sectional view of an RCIGBT in examples of the present disclosure.

FIG. 6 is a cross sectional view of an RCIGBT 600 in examples of the present disclosure. The RCIGBT 600 comprises an IGBT contact area 622, a diode contact area 624 adjacent to the IGBT contact area 622, an N drift layer 632 attached to the IGBT contact area 622 and the diode contact area 624, a P− base layer 642 attached to the N drift layer 632, an emitter metal layer 652, and a plurality of trench gates 662 passing through the P− base layer 642.

Those of ordinary skill in the art may recognize that modifications of the embodiments disclosed herein are possible. For example, a number of the RCIGBTs fabricated from one wafer may vary. The thickness of the wafer may vary. A pitch between an FRD and an adjacent FRD may vary. Other modifications may occur to those of ordinary skill in this art, and all such modifications are deemed to fall within the purview of the present invention, as defined by the claims.

The invention claimed is:

1. A method for fabricating a plurality of reverse conducting insulated gate bipolar transistors (RCIGBTs), the method comprising the steps of:
   providing a wafer comprising a plurality of insulated gate bipolar transistors (IGBT) top structures formed on a first side of the wafer;
   patterning a mask on a second side of the wafer, the second side of the wafer being opposite the first side of the wafer;
   applying an etching process forming a plurality of trenches on the second side of the wafer;
   removing the mask;
   implanting N++ type dopant from the second side of the wafer into a plurality of bottom surfaces of the plurality of trenches;
   applying a grinding process reducing a thickness of the wafer from the second side of the wafer to the plurality of bottom surfaces of the plurality of trenches;
   implanting P+ type dopant from the second side forming a plurality of P+ regions and a plurality of N+ regions;
   depositing a metal layer overlaying the plurality of P+ regions and the plurality of N+ regions; and
   applying a singulation process to separate the plurality of IGBT top structures into the plurality of RCIGBTs.

2. The method for fabricating the plurality of RCIGBTs of claim 1, wherein the wafer comprising the plurality of IGBT top structures formed on the first side of the wafer is provided with a predetermined thickness in a range from two hundred to seven hundred microns.

3. The method for fabricating the plurality of RCIGBTs of claim 2, before the step of patterning the mask on the second side of the wafer, wherein an entirety of the wafer is flat through an edge of the wafer.

4. The method for fabricating the plurality of RCIGBTs of claim 1, further comprising a step of grinding the wafer to a thickness ranging from two hundred to seven hundred microns from the second side before the step of patterning the mask on the second side of the wafer.

5. The method for fabricating the plurality of RCIGBTs of claim 1, wherein a thickness from the plurality of bottom surfaces of the plurality of trenches to a top surface of the wafer on the first side is fifty to ninety microns.

6. The method for fabricating the plurality of RCIGBTs of claim 1, wherein a width of each of the plurality of N+ regions is at least thirty microns.

7. The method for fabricating the plurality of RCIGBTs of claim 6, wherein each of the plurality of N+ regions is a square area separated by P+ regions.

8. The method for fabricating the plurality of RCIGBTs of claim 1, wherein the mask is a soft mask; and wherein the step of patterning the mask on the second side of the wafer comprises the sub-step of lithography patterning the soft mask on the wafer.

9. The method for fabricating the plurality of RCIGBTs of claim 8, after applying the etching process, wherein the soft mask comprises a plurality of overhang regions.

10. The method for fabricating the plurality of RCIGBTs of claim 1, wherein the mask is a hard mask; and wherein the step of patterning the mask on the second side of the wafer comprises the sub-steps of
generating an oxidation layer on the wafer; and
removing a plurality of portions of the oxidation layer forming the hard mask.

11. The method for fabricating the plurality of RCIGBTs of claim 1, wherein the step of applying the etching process comprises the sub-step of
applying a wet etching so that a thickness from the plurality of bottom surfaces of the plurality of trenches to a top surface of the wafer on the first side is in a range from fifty microns to ninety microns.

12. The method for fabricating the plurality of RCIGBTs of claim 1, wherein the step of applying the etching process comprises the sub-steps of
applying a wet etching; and
applying a dry etching so that a thickness from the plurality of bottom surfaces of the plurality of trenches to a top surface of the wafer on the first side is in a range from fifty microns to ninety microns.

13. The method for fabricating the plurality of RCIGBTs of claim 1, wherein the step of applying the etching process comprises the sub-step of
applying a dry etching so that a thickness from the plurality of bottom surfaces of the plurality of trenches to a top surface of the wafer on the first side is in a range from fifty microns to ninety microns.

14. The method for fabricating the plurality of RCIGBTs of claim 1, wherein each of the plurality of RCIGBTs comprises
an IGBT contact area;
a diode contact area adjacent to the IGBT contact area;
an N drift layer attached to the IGBT contact area and the diode contact area;
a P– base layer attached to the N drift layer;
an emitter metal layer; and
a plurality of trench gates passing through the P– base layer.

15. The method for fabricating the plurality of RCIGBTs of claim 14, wherein a window size of a fast recovery diode (FRD) area is at least thirty microns by thirty microns; and wherein a pitch between the FRD and an adjacent FRD is in a range from one millimeter to two millimeters.

\* \* \* \* \*